(12) United States Patent
Amano

(10) Patent No.: US 6,462,999 B1
(45) Date of Patent: Oct. 8, 2002

(54) SEMICONDUCTOR MEMORY DEVICE HAVING INTERNAL DATA READ CIRCUIT EXCELLENT IN NOISE IMMUNITY

(75) Inventor: Teruhiko Amano, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/906,649

(22) Filed: Jul. 18, 2001

(30) Foreign Application Priority Data

Dec. 18, 2000 (JP) ........................................ 2000-383397

(51) Int. Cl.[7] ................................................ G11C 7/00
(52) U.S. Cl. ........................ 365/205; 365/206; 365/207
(58) Field of Search ................................. 365/205, 206, 365/227

(56) References Cited

U.S. PATENT DOCUMENTS

| | | | |
|---|---|---|---|
| 4,586,168 | * 4/1986 | Adlhoch et al. ............ | 365/189 |
| 5,724,292 | * 3/1998 | Wada ........................... | 365/207 |
| 6,141,286 | * 10/2000 | Vo et al. ................. | 365/230.03 |
| 6,249,476 | * 6/2001 | Yamazaki et al. ..... | 365/230.03 |
| 6,275,432 | * 8/2001 | Hardee ....................... | 365/205 |
| 6,292,418 | * 9/2001 | Kawashima et al. ....... | 365/205 |
| 6,345,006 | * 2/2002 | Igalls et al. ................. | 365/205 |

FOREIGN PATENT DOCUMENTS

| | | |
|---|---|---|
| JP | 57-152586 | 9/1982 |
| JP | 11-232871 | 8/1999 |

* cited by examiner

*Primary Examiner*—Richard Elms
*Assistant Examiner*—Tuan T. Nguyen
(74) *Attorney, Agent, or Firm*—McDermott, Will & Emery

(57) ABSTRACT

In the configuration of a charge confinement type sense amplifier, activation/inactivation of a charge containing gate and activation/inactivation of a sense amplifier circuit are controlled by different control signals. Thus, a layout area of the sense amplifier for reading of internal data is reduced.

8 Claims, 12 Drawing Sheets

SEMICONDUCTOR MEMORY DEVICE HAVING INTERNAL DATA READ CIRCUIT EXCELLENT IN NOISE IMMUNITY

BACKGROUND OF THE INVENTION

1. Field of the Invention

The present invention relates to a configuration of a portion for reading of internal data in a semiconductor memory device. More particularly, the present invention relates to a sense amplifier circuit for internally amplifying data of a selected memory cell.

2. Description of the Background Art

FIG. 9 shows an exemplary configuration of a memory cell in a conventional static random access memory (SRAM). Referring to FIG. 9, the memory cell MC includes: a P channel MOS transistor (insulated gate type field effect transistor) MP01 connected between a power supply node and a storage node NDA and having its gate connected to a storage node NDB; a P channel MOS transistor MP02 connected between a power supply node and storage node NDB and having its gate connected to storage node NDA; an N channel MOS transistor MN03 connected between storage node NDA and a ground node and having its gate connected to storage node NDB; an N channel MOS transistor MN04 connected between storage node NDB and a ground node and having its gate connected to storage node NDA; an N channel MOS transistor MN05 rendered conductive selectively in response to a signal potential on a word line WL to connect storage node NDA to a bit line BL; and an N channel MOS transistor MN06 rendered conductive selectively in response to the signal potential on the word line WL to connect storage node NDB to a bit line /BL.

MOS transistors MP01 and MN03 constitute a CMOS inverter circuit, and MOS transistors MP02 and MN04 constitute another CMOS inverter circuit. These CMOS inverter circuits have their inputs and outputs cross-coupled to each other, thereby constituting a flip-flop. Storage nodes NDA and NDB latch data complementary with each other.

In access to memory cell MC (for data writing/reading), word line WL is driven to a selected state, and its voltage level attains an H level. In response, MOS transistors MN05 and MN06 are rendered conductive, and storage nodes NDA and NDB are connected to bit lines BL and /BL, respectively. In data reading, a voltage difference occurs between bit lines BL and /BL according to the voltages on storage nodes NDA and NDB. The voltage difference is sensed to be read in the data reading.

In data writing, complementary write data are transmitted to bit lines BL and /BL. The voltage levels of storage nodes NDA and NDB are set according to the write data.

In the configuration of SRAM cell MC shown in FIG. 9, load transistors MP01 and MP02 for retaining data of an H level are each formed, e.g., of a thin film transistor (TFT), which allows reduction in occupying area compared to the case where a pure resistance element is utilized for the load element. These load transistors (P channel MOS transistors) MP01 and MP02 have equivalent resistance values in the non-conductive states significantly greater than those in the conductive states. Thus, compared to the case where the pure resistance element is utilized as the load element, a through current and hence, current consumption during retaining data, can be reduced.

FIG. 10 schematically shows a configuration of a portion related to data reading in a conventional SRAM. Referring to FIG. 10, memory cells MC are arranged in rows and columns. Each memory cell MC has a configuration as shown in FIG. 9. Word lines WL0, WL1, . . . are placed corresponding to respective rows of memory cells MC, and bit line pairs BL0, /BL0; BL1, /BL1, . . . are placed corresponding to respective columns of memory cells MC. Bit line precharge/equalize circuits BPE0, BPE1 are provided for bit line pairs BL0 and /BL0, BL1 and /BL1, respectively, for precharging and equalizing the corresponding bit line pairs BL0 and /BL0; BL1 and /BL1 to a power supply voltage VDD level in response to a precharge/equalize instructing signal /BLEQ.

Column select gates CSG0, CSG1 are provided for bit line pairs BL0 and /BL0, BL1 and /BL1, respectively, which connect the corresponding bit line pair to an internal data line pair IOP according to column select signals on column select lines CSL0, CSL1, respectively. Column select gate CSG0 includes a CMOS transmission gate TX00 provided for bit line BL0 and a CMOS transmission gate TX01 provided for bit line /BL0, and is rendered conductive in response to the column select signal on column select line CSL0 and an output signal of an inverter IVa receiving this column select signal. Each of CMOS transmission gates TX00 and TX01 includes a P channel MOS transistor PQ and an N channel MOS transistor NQ that are connected in parallel with each other.

Column select gate CSG1 includes a CMOS transmission gate TX10 provided for bit line BL1 and a CMOS transmission gate TX11 provided for bit line /BL1, and is rendered conductive in response to the column select signal on column select line CSLL and an output signal of an inverter IVb receiving this column select signal.

One bit line pair is selected by the column select signals on the column select lines, and the selected bit line pair is connected via the corresponding column select gate to internal data line pair IOP.

For internal data line pair IOP, there are provided a data line precharge/equalize circuit IPE that is responsive to activation of precharge/equalize instructing signal /BLEQ for precharging and equalizing internal data line pair IOP to a power supply voltage level, and a sense amplifier 100 that is responsive to activation of a sense amplifier activating signal SAE for differentially amplifying the signals on internal data line pair IOP to generate internal read data Dout and /Dout. Specifically, sense amplifier 100, when activated, differentially amplifies a voltage difference, appearing on internal data line pair IOP, corresponding to data of a selected memory cell, and generates complementary internal read data Dout and /Dout. The detailed configuration of sense amplifier 100 will be described later.

In the SRAM shown in FIG. 10, in the stand-by state, bit line precharge/equalize circuits BPE0, BPE1, . . . and data line precharge/equalize circuit IPE are in an active state. Bite line pairs BL0, /BL0; /BL1, /BL1, . . . are held at a power supply voltage level, and internal data line pair IOP is precharged and equalized to the power supply voltage level.

When a data access cycle for data writing/reading starts, a word line corresponding to an addressed row is driven to a selected state, and storage data in the memory cells connected to the selected word line are read out to the corresponding bit line pairs. Memory cells MC each have a configuration as shown in FIG. 9, so that complementary data on bit lines BL and /BL are read out to the corresponding bit line pairs. In the data reading, bit line precharge/equalize circuits BPE0, BPE1, . . . are in an inactive state. Thus, voltage differences according to the storage data in the selected memory cells (memory cells connected to the selected word line) are generated in the respective bit line pairs.

Further, the column select line corresponding to an addressed column is driven to a selected state, and column select gate CSG connected to this selected column select line is rendered conductive. The bit line pair corresponding to the selected column is connected to internal data line pair IOP, and the voltage difference corresponding to the storage data in the selected memory cell is generated on this internal data line pair IOP. Here, data line precharge/equalize circuit IPE is already driven to an inactive state upon entering the access cycle.

Sense amplifier 100 differentially amplifies this voltage difference of internal data line pair IOP to generate internal read data Dout and /Dout.

FIG. 11 shows, by way of example, specific configurations of bit line precharge/equalize circuits BPE0, IPE and sense amplifier 100 shown in FIG. 10. In FIG. 11, one bit line pair BL#, /BL# is shown representatively.

Bit line precharge/equalize circuit BPE# provided for bit lines BL# and /BL# includes: precharging P channel MOS transistors PQ1 and PQ2 that are rendered conductive when precharge/equalize signal /BLEQ is activated (to an L level), and transmit a power supply voltage VDD to bit lines BL# and /BL# when made conductive; and an equalizing P channel MOS transistor PQ3 that is rendered conductive when precharge/equalize instructing signal /BLEQ is activated, and electrically short-circuits bit lines BL# and /BL# when rendered conductive.

Data line precharge/equalize circuit IPE includes: precharging P channel MOS transistors PQ4 and PQ5 that are rendered conductive, when precharge/equalize instructing signal /BLEQ is activated, to transmit power supply voltage VDD to respective internal nodes SAL and /SAL; and an equalizing P channel MOS transistor PQ6 that is rendered conductive, when precharge/equalize instructing signal /BLEQ is activated, to electrically short-circuits internal nodes SAL and /SAL. Internal nodes SAL and /SAL are connected to respective internal data lines of internal data line pair IOP shown in FIG. 10.

Bit lines BL# and /BL# are coupled to respective internal nodes SAL and /SAL via column select gate CSG#. Column select gate CSG# includes CMOS transmission gates TX#0 and TX#1 provided for bit lines BL# and /BL#, respectively. These CMOS transmission gates TX#0 and TX#1 are rendered conductive selectively in response to the column select signal on column select line CSL and an output signal of an inverter IV# receiving this column select signal.

Sense amplifier 100 includes: a P channel MOS transistor PQ7 connected between a power supply node and sense internal node SAN and having its gate connected to a sense internal node /SAN; a P channel MOS transistor PQ8 connected between a power supply node and sense internal node /SAN and having its gate connected to sense internal node SAN; an N channel MOS transistor NQ1 connected between sense internal node SAN and a node NDC and having its gate connected to sense internal node /SAN; an N channel MOS transistor NQ2 connected between sense internal node /SAN and node NDC and having its gate connected to sense internal node SAN; an N channel MOS transistor NQ3 connected between node NDC and a ground node and having its gate receiving sense amplifier activating signal SAE; an inverter IVc inverting a signal on sense internal node SAN to generate internal read data Dout; an inverter IVd inverting a signal on sense internal node /SAN to generate complementary internal read data /Dout; and P channel MOS transistors PQ9 and PQ10 that are rendered conductive, when sense amplifier activating signal SAE is inactivated, to connect internal nodes SAL and /SAL to sense internal nodes SAN and /SAN, respectively.

When sense amplifier activating signal SAE is in an inactive state, sense internal nodes SAN and /SAN in sense amplifier 100 are connected to internal nodes SAL and /SAL. When sense amplifier activating signal SAE is activated, MOS transistors PQ9 and PQ10 are rendered non-conductive, and sense internal nodes SAN and /SAN are isolated from internal nodes SAL and /SAL. MOS transistor NQ3 in sense amplifier 100 is rendered conductive in response to activation of sense activating signal SAE. In this state, i.e., in the state where charges are confined in sense internal nodes SAN and /SAN, sense internal nodes SAN and /SAN are driven according to their voltage levels.

Sense internal nodes SAN and /SAN are provided with stabilizing capacitors NCa and NCb, respectively, for stabilization of voltages of sense internal nodes SAN and /SAN. Now, the operation of the reading circuitry of the SRAM shown in FIG. 11 will be described with reference to operating signal waveforms in FIG. 12.

This SRAM is a clock synchronous type SRAM that operates in synchronization with a reference clock signal CLK. In this clock synchronous SRAM, a read command READ designating data reading is provided in synchronization with a rising edge of reference clock signal CLK. Read command READ is provided by setting a chip select signal /CS to an L level and a write enable signal /WE to an H level at a rising edge of reference clock signal CLK. An address signal is also supplied at the rising edge of reference clock CLK.

When read command READ is supplied, a control circuit (not shown) first drives precharge/equalize signal /BLEQ from an active state of an L level to an inactive state of an H level to cancel the internal equalized state. It then drives all the MOS transistors PQ1–PQ3 in bit line precharge/equalize circuit BPE# to an OFF state, and drives all the MOS transistors PQ4–PQ6 within data line precharge/equalize circuit IPE to an OFF state. The precharging operation of bit lines BL# and /BL# and internal data line pair IOP is completed when precharge/equalize instructing signal /BLEQ is inactivated.

According to the read command READ, the control circuit (not shown) takes in the address signal at a rising edge of reference clock signal CLK, decodes the address signal, and drives word line WL and column select line CSL corresponding to the addressed row and column to a selected state. In the memory cell MC connected to the selected word line WL, MOS transistors MN05 and MN06 shown in FIG. 9 are rendered conductive, and a voltage difference is produced between bit lines BL# and /BL# according to data stored in storage nodes NDA and NDB of the associated memory cell.

Column select gate CSG# is rendered conductive in response to the column select signal on column select line CSL, and bit lines BL# and /BL# corresponding to the addressed column are connected to internal nodes SAL and /SAL (internal data line pair IOP). In response, the voltages corresponding to memory cell data read out onto the associated bit lines BL# and /BL# are transmitted to internal nodes SAL and /SAL. The voltage differences between bit lines BL# and /BL# and between internal nodes SAL and /SAL (internal data line pair IOP) become a sufficient large voltage difference ΔV after an elapse of a time Ta since the application of read command READ.

During the time Ta, sense amplifier activating signal SAE is in an inactive state of an L level, and MOS transistors PQ9 and PQ10 in sense amplifier 100, shown in FIG. 11, are in a conductive state. The voltage difference between internal nodes SAL and /SAL is transmitted to sense internal nodes SAN and /SAN, and thus, the voltage difference ΔV corresponding to data of the selected memory cell on bit lines BL# and /BL# is transmitted to sense internal nodes SAN and /SAN. After an elapse of time Ts since application of the read command, this voltage difference of sense internal nodes SAN and /SAN becomes a sufficient large ΔV, and sense amplifier activating signal SAE is driven to an H level. Responsively, MOS transistors PQ9 and PQ10 are rendered non-conductive and MOS transistor NQ3 is rendered conductive, so that sense amplifier 100 is activated to amplify the voltage difference of sense internal nodes SAN and /SAN.

When sense amplifier 100 is in an active state, MOS transistors PQ9 and PQ1 are kept non-conductive. Sense internal nodes SAN and /SAN are being isolated from bit lines BL#, /BL# and internal nodes SAL, /SAL (internal data line pair). Thus, sense amplifier 100 drives small capacitance of internal sense nodes SAN and /SAN to perform a fast amplifying operation, thereby generating internal read data Dout and /Dout.

When the sense operation is completed, sense amplifier activating signal SAE attains an L level, and selected word line WL and selected column select line CSL are driven to a non-selected state. MOS transistors MN05 and MN06 used in accessing memory cell MC are rendered nonconductive, and column select gate CSG# also becomes non-conductive. Precharge/equalize instructing signal /BLEQ attains an active state of an L level, and bit lines BL#, /BL# and internal data line pair IOP are again precharged and equalized to the power supply voltage level.

The SRAM memory cell is a flip-flop type memory cell, in which data reading is performed non-destructively, unlike the case of a DRAM (dynamic random access memory). Therefore, a restore operation of rewriting data read out from a memory cell to the memory cell becomes unnecessary, which reduces the cycle time, thereby enabling rapid access.

In sense amplifier 100, the sense operation is performed while the charges are being confined on sense internal nodes SAN and /SAN. Therefore, the load to be driven in the sense operation is small, which allows a fast sense operation, thereby enabling fast data reading.

With the configuration of the sense amplifier shown in FIG. 11, the sense operation is performed when sense amplifier activating signal SAE attains an H level, with the charges transmitted from bit lines BL# and /BL# being confined on sense internal nodes SAN and /SAN. However, these sense internal nodes SAN and /SAN are nodes within sense amplifier 100 and their capacitance is small. Therefore, these nodes are likely to fluctuate in potential when receiving noise due to coupling from adjacent circuits or other at the start of the sense operation, which increases the possibility of malfunction of sense amplifier 100.

As a countermeasure conventionally taken in order to suppress such influences of coupling noise and others on the charges confined in the sense internal nodes, as shown in FIG. 11, gate capacitors NCa and NCb, each formed of a MOS transistor, are connected to sense internal nodes SAN and /SAN, respectively, to provide a capacitance of a significant capacitance value, besides the interconnection line capacitance or parasitic capacitance such as junction capacitance of transistor, for increasing the capacitance values of the sense internal nodes /SAL and SAL, to enhance the noise immunity of sense internal nodes SAN and /SAN.

According to such countermeasure, such gate capacitors NCa and NCb, however, are required to be placed in the sense amplifier 100, and such requirement increases the layout area of the sense amplifier, and correspondingly, the chip manufacturing cost is increased due to the increase of the chip area.

Further, any amplifying circuit for internally transferring a small-amplitude signal will encounter the same problems as the sense amplifier as described above.

SUMMARY OF THE INVENTION

An object of the present invention is to provide an internal signal amplifying circuit improved in resistance to noise without increasing the layout area.

Another object of the present invention is to provide an internal data reading circuit with excellent noise immunity and a small occupying area.

A specific object of the present invention is to provide a semiconductor memory device including a sense amplifier circuit excellent in noise immunity and having a reduced layout area.

A semiconductor memory device according to an aspect of the present invention includes: an internal signal line for transmitting data of a selected memory cell; a sense amplifier activated, when a sense amplifier activating signal is activated, for amplifying a voltage of a sense internal node; and a charge confinement gate responsive to activation of an isolation control signal that differs from the sense amplifier activating signal, for isolating the internal signal line from the sense internal node.

A semiconductor memory device according to another aspect of the present invention includes: a plurality of memory cells arranged in rows and columns; a sense amplifier commonly provided for the plurality of memory cells, for amplifying, when activated, data of a selected memory cell of the plurality of memory cells; a sense control circuit responsive to a reading operation instructing signal, for generating a sense amplifier activating signal to activate the sense amplifier; a confinement gate circuit provided corresponding to each column of the memory cells, for coupling, when made conductive, the corresponding column to an internal node of the sense amplifier; and a confinement control circuit responsive to the reading operation instructing signal and a column address signal, for setting the confinement gate provided corresponding to an addressed column to a conductive state for a prescribed period of time.

A semiconductor memory device according to a further aspect of the present invention includes: a plurality of memory cells arranged in rows and columns; a sense amplifier commonly provided for the plurality of memory cells, for amplifying, when activated, data of a selected memory cell of the plurality of memory cells; a sense control circuit responsive to a reading operation instructing signal, for generating a sense amplifier activating signal to activate the sense amplifier; a column select gate responsive to a column select signal, for coupling an addressed column to an internal signal line; a confinement gate for coupling the internal signal line to an internal node of the sense amplifier when made conductive; and a confinement control circuit responsive to the reading operation instructing signal for setting the confinement gate to a conductive state for a prescribed period of time.

Preferably, the sense amplifier activating signal is activated before the confinement gate is rendered non-conductive.

The control signal for controlling the charge confinement gate of the sense amplifier and the sense amplifier activating signal for controlling activation/inactivation of the sense amplifier are provided separately. Accordingly, the charge confinement gate and the sense amplifier each can be activated at an optimum timing. Specifically, the sense amplifier can be activated at a timing at which the charges accumulated in the sense internal node are prevented from being affected by coupling noise or the like.

In particular, by activating the sense amplifier upon conduction of the charge confinement gate, the sense internal node is coupled to the selected memory cell column. Accordingly, the capacitance of the sense internal node becomes large, so that the influence of the noise can be suppressed.

One gate is utilized both for the column select gate and for the charge confinement gate. Thus, a transistor dedicated for charge confinement becomes unnecessary. This elimination reduces the number of transistors, and thus, the area occupied by the reading circuitry can be decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
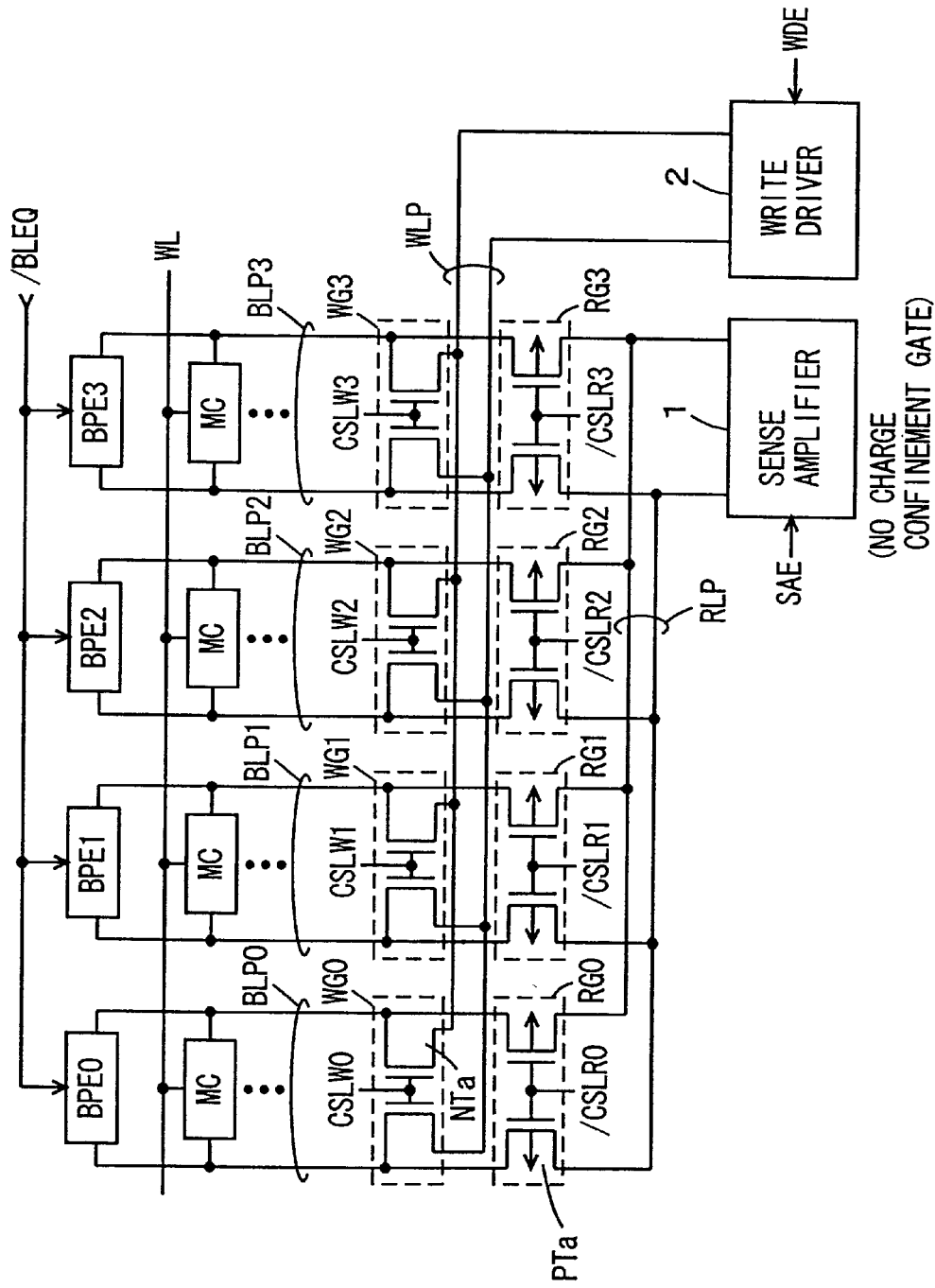
FIG. 1 schematically shows a configuration of a portion related to data writting/reading of an SRAM, according to a first embodiment of the present invention.

FIG. 1 schematically shows a configuration of a portion related to data reading/writing of an SRAM according to the first embodiment of the present invention. Referring to FIG. 1, four bit line pairs BLP0–BLP3 are shown representatively. Corresponding to these bit line pairs BLP0–BLP3, there are provided bit line precharge/equalize circuits BPE0–BPE3, respectively, which are responsive to activation of a bit line precharge/equalize instructing signal /BLEQ for precharging and equalizing the corresponding bit line pairs BLP0–BLP3 to a power supply voltage level. Precharge/equalize instructing signal /BLEQ is used to control precharging/equalizing of bit lines, and is not used to control precharging/equalizing of an internal node of the sense amplifier. Thus, hereinafter, signal /BLEQ is referred to as the bit line precharge/equalize instructing signal.

Bit line pairs BLP0–BLP3 are coupled to a write driver 2 via write column select gates WG0–WG3, respectively, and also coupled to a sense amplifier 1 via respective read column select gates RG0–RG3.

Write column select gates WG0–WG3 are rendered conductive in response to the signals on the corresponding write column select lines CSLW0–CSLW3 selectively activated according to a column address signal in data writing, and couple the corresponding bit line pairs to an internal write data line pair WLP when made conductive.

Read column select gates RG0–RG3 are rendered conductive in response to the signals on the corresponding read column select lines CSLR0–CSLR3 selectively activated according to the column address signal in data reading, and couple the corresponding bit line pairs via an internal read data line pair RLP to sense amplifier 1 when made conductive. Sense amplifier 1 is not provided with a charge confinement gate, and the internal read data line pair RLP is connected to a sense internal node within sense amplifier 1. In the present embodiment, read column select gates RG0–RG3 are utilized as the charge confinement gates.

Sense amplifier 1 is activated in response to activation of a sense amplifier activating signal SAE. Write driver 2 is activated in response to activation of a write driver activating signal WDE, and drives internal write data line pair WLP according to write data (not shown) when activated.

Write column select gates WG0–WG3 each include an N channel MOS transistor NTa that is provided for each bit line of the corresponding bit line pair. Read column select gates RG0–RG3 each include a P channel MOS transistor PTa that is provided for each bit line of the corresponding bit line pair. Although the internal write data transmission path and the internal read data transmission path are provided separately, the number of transistors is not increased, as compared to the conventional case where a CMOS transmission gate is utilized as a column select gate.

With read column select gates RG0–RG3 as the charge confinement gates, it becomes possible to independently adjust the time period during which sense amplifier 1 is activated and the time period during which read column select gates RG0–RG3 operating as the charge confinement gates are rendered conductive. It also becomes possible to perform a sense operation while suppressing influences of coupling noise and others in confinement of the charges. In addition, since the sense internal node of sense amplifier 1 is connected to the internal read data line of internal read data line pair RLP and to the bit line of a selected column, the capacitance of the sense internal node can be increased equivalently, so that the immunity against noise can be improved.

Figure 2:
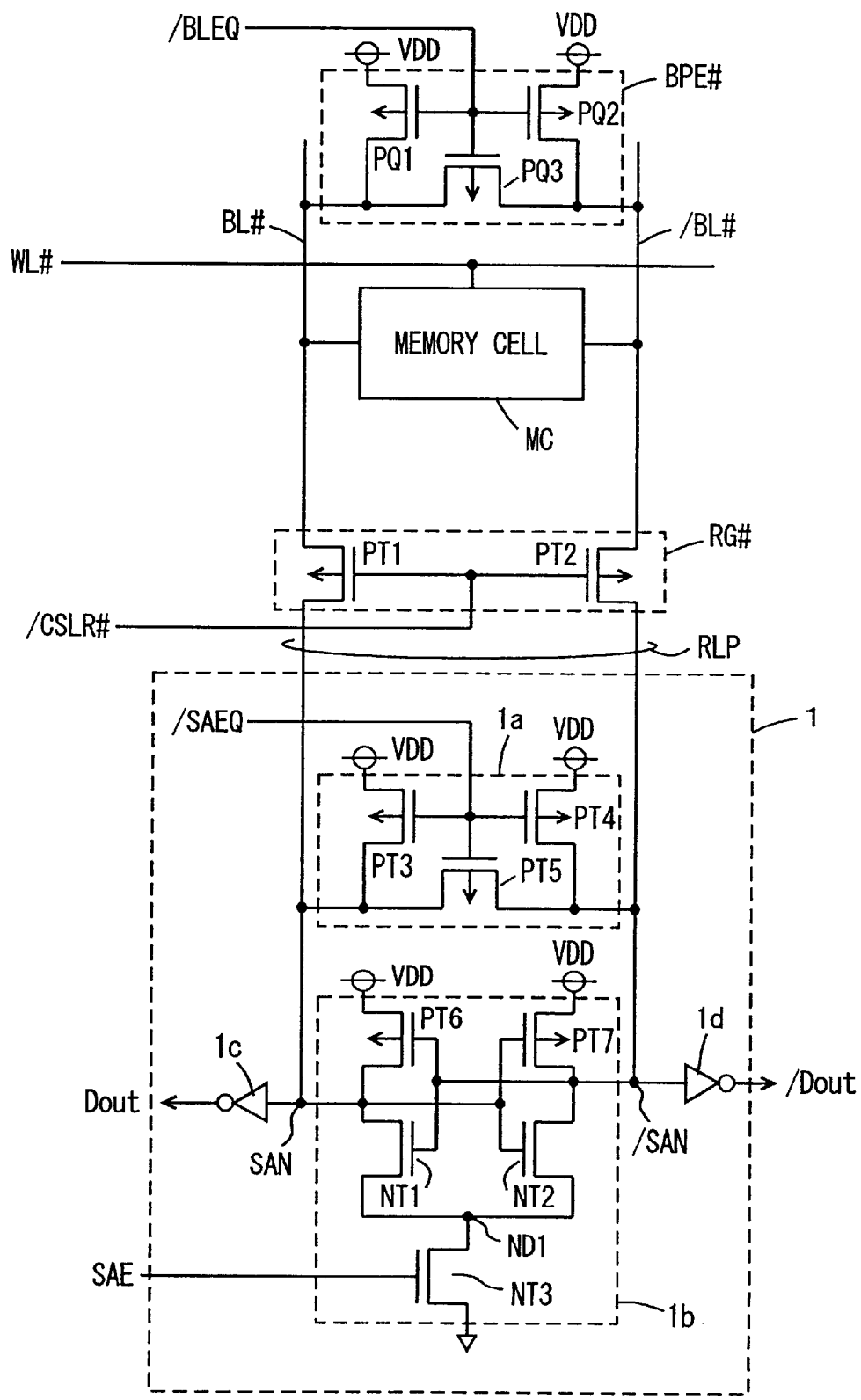
FIG. 2 shows a specific configuration of a main portion of the SRAM according to the first embodiment.

FIG. 2 shows a specific configuration of a portion related to data reading in the SRAM shown in FIG. 1. In FIG. 2, one pair of bit lines BL# and /BL# is shown representatively. Corresponding to this bit line pair BL# and /BL#, a bit line precharge/equalize circuit BPE# is provided, which is responsive to activation of bit line precharge/equalize instructing signal /BLEQ for precharging and equalizing bit lines BL# and /BL# to a power supply voltage VDD level. Bit line precharge/equalize circuit BPE# includes, as in the conventional case, precharging P channel MOS transistors PQ1 and PQ2 that are rendered conductive, in response to activation of bit line precharge/equalize instructing signal /BLEQ, to transmit power supply voltage VDD to bit lines BL# and /BL#, and an equalizing P channel MOS transistor PQ3 that is rendered conductive, in response to activation of bit line precharge/equalize instructing signal /BLEQ, to electrically short-circuit bit lines BL# and /BL#.

Bit lines BL# and /BL# are coupled via read column select gate RG# to sense internal nodes SAN and /SAN, respectively. Read column select gate RG# includes P channel MOS transistors PT1 and PT2 that are rendered conductive, in response to a column select signal on a read column select line /CSLR, to connect bit lines BL# and /BL# to respective sense internal nodes SAN and /SAN. Read column select line /CSLR is driven to an L level when selected.

Sense internal nodes SAN and /SAN are coupled to respective internal read data lines of internal read data line pair RLP shown in FIG. 1, to which a plurality of read column select gates RG (RG#) are connected in parallel with each other. These read column select gates RG# used for selecting columns in data reading are also utilized for confining charges.

Sense amplifier 1 includes: a sense precharge/equalize circuit 1a that is responsive to activation of a sense internal node precharge/equalize instructing signal /SAEQ for precharging and equalizing sense internal nodes SAN and /SAN to a power supply voltage VDD level; a sense amplifier circuit 1b that is responsive to activation of sense amplifier activating signal SAE for differentially amplifying the voltages of sense internal nodes SAN and /SAN; an inverter 1c that inverts the signal of sense internal node SAN to generate internal read data Dout; and an inverter 1d that inverts the signal of sense internal node /SAN to generate complementary internal read data /Dout.

Sense precharge/equalize circuit 1a includes: precharging P channel MOS transistors PT3 and PT4 that are rendered conductive, in response to activation of sense internal node precharge/equalize instructing signal /SAEQ, to precharge sense internal nodes SAN and /SAN to a power supply voltage VDD level; and an equalizing P channel MOS transistor PT5 that is rendered conductive, in response to activation of sense internal node precharge/equalize instructing signal /SAEQ, to electrically short-circuit sense internal nodes SAN and /SAN.

Sense amplifier circuit 1b includes: a P channel MOS transistor PT6 connected between a power supply node and sense internal node SAN and having its gate connected to sense internal node /SAN; a P channel MOS transistor PT7 connected between a power supply node and sense internal node /SAN and having its gate connected to sense internal node SAN; an N channel MOS transistor NT1 connected between sense internal node SAN and a node ND1 and having its gate connected to sense internal node /SAN; an N channel MOS transistor NT2 connected between sense internal node /SAN and node ND1 and having its gate connected to sense internal node SAN; and an N channel MOS transistor NT3 connected between node ND1 and a ground node and having its gate receiving sense amplifier activating signal SAE.

Figure 3:
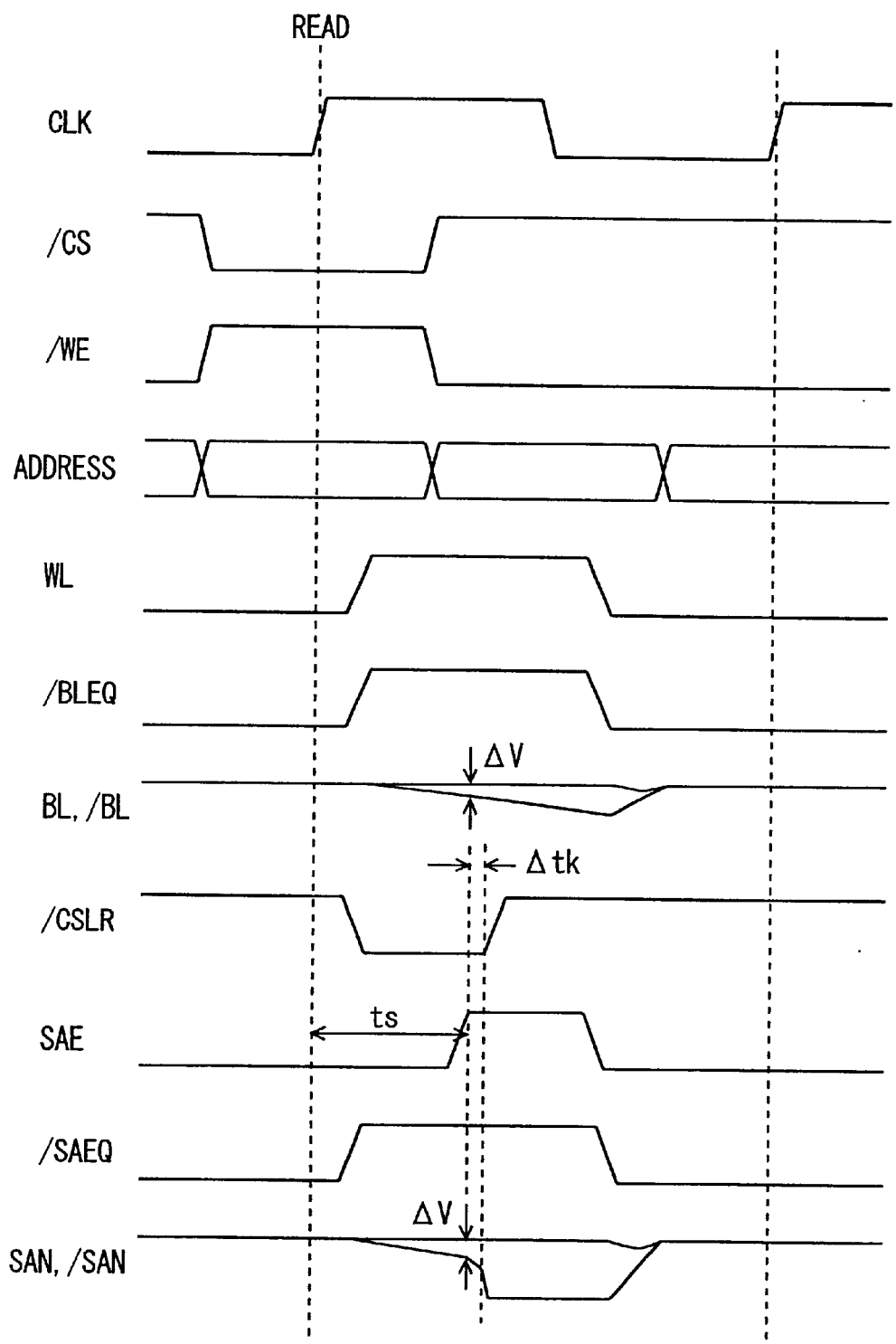
FIG. 3 shows signal waveforms representing an operation of the configuration shown in FIG. 2.

As shown in FIG. 2, no gate capacitance is connected to sense internal nodes SAN and /SAN. In the present embodiment, sense amplifier circuit 1b is activated when read column select gate RG# is made conductive. Thus, the sense operation is performed under the state where the bit line capacitance and the internal read data line capacitance are connected to each respective sense internal node. Thus, the capacitance of the sense internal nodes is increased at the start of the sense operation, to suppress the influences of coupling noise or the like, so that a stable sense operation can be achieved. Now, the operation of the data reading circuitry shown in FIG. 2 will now be described with reference to signal waveforms in FIG. 3.

In the stand-by state, bit line precharge/equalize instructing signal /BLEQ and sense internal node precharge/equalize instructing signal /SAEQ are both in an active state of an L level. Thus, bit line precharge/equalize circuit BPE# and sense precharge/equalize circuit 1a both are in an active state, and bit lines BL# and /BL# and sense internal nodes SAN and /SAN are precharged and equalized to the power supply voltage VDD level.

A read command READ is supplied at a rising edge of reference clock signal CLK. At the same time, an address signal designating a position of a memory cell to be accessed is supplied. When read command READ is supplied, a control circuit (not shown) first drives bit line precharge/equalize instructing signal /BLEQ to an inactive state of an H level to reset the precharge/equalize state, and thus complete the precharging/equalizing operation on bit lines BL# and /BL# by bit line precharge/equalize circuit BPE#. The control circuit also drives sense internal node precharge/equalize instructing signal /SAEQ to an inactive state of an H level to complete the precharging/equalizing operation on sense internal nodes SAN and /SAN by sense precharge/equalize circuit 1a.

According to the address signal supplied concurrently with read command READ, a word line WL (word line WL# in the case of FIG. 2) corresponding to an addressed row is driven to a selected state. Storage data in the memory cells connected to this selected word line WL are read out to corresponding bit lines BL, /BL (BL#, /BL# in FIG. 2). A column select operation is also performed in parallel with this word line select operation. A signal potential on read column select line /CSLR corresponding to the selected column is driven to an active state of an L level for a prescribed period of time, and bit lines BL and /BL of the selected column are coupled to sense internal nodes SAN and /SAN. Accordingly, the voltages of bit lines BL and /BL of the selected column are transmitted to sense internal nodes SAN and /SAN, respectively.

After an elapse of time ts since application of read command READ and when a voltage difference ΔV of bit lines BL and /BL is transmitted to sense internal nodes SAN and /SAN, sense amplifier activating signal SAE is driven to an active state of an L level and, in response, sense amplifier circuit 1b is activated. When sense amplifier circuit 1b activated is to perform a sense operation, read column select line /CSLR is in a selected state, and selected bit lines BL and /BL are coupled to sense internal nodes SAN and /SAN.

Accordingly, at the start of the sense operation of sense amplifier circuit 1b, not only the load capacitance of the internal read data lines but also the load capacitance of bit lines BL and /BL are electrically connected to sense internal nodes SAN and /SAN. Therefore, sense internal nodes SAN and /SAN each have a large capacitance, which substantially eliminates the possibility of fluctuation of sense internal node potentials due to noise generated through coupling of adjacent circuits or others. Such utilization of load capacitance (parasitic capacitance) of bit lines, instead of conventional gate capacitance, also reduces the layout area of the sense amplifier.

After an elapse of a time Δtk since the activation of sense amplifier activating signal SAE, read column select line /CSLR is driven to an inactive state, and read column select gate RG (RG# in FIG. 2) is rendered nonconductive. A charge confinement sensing operation is performed, so that the voltage difference of sense internal nodes SAN and /SAN is rapidly driven from the voltage difference ΔV level to the power supply voltage VDD level. The sense operation is performed relatively moderately while the bit line load capacitance is connected to sense internal nodes SAN and /SAN, and the voltage levels of sense internal nodes SAN and /SAN are amplified stably. After the voltage levels of sense internal nodes SAN and /SAN have been amplified sufficiently, the amplifying operation is performed rapidly by the charge confinement sense operation.

When the data reading operation is completed, a control circuit (not shown) drives selected word line WL to a non-selected state and also inactivates sense amplifier activating signal SAE. It further inactivates bit line precharge/ equalize instructing signal /BLEQ and sense precharge/ equalize instructing signal /SAEQ, so that each circuit returns to the precharge state.

As read column select gate RG (RG# or the like) is utilized as the charge confinement gate, bit lines BL and /BL (BL#, /BL# in FIG. 2) are each connected to the sense internal node via a MOS transistor of one stage. Thus, unlike the conventional configuration in which the bit line voltage is transmitted to the sense internal node through serially coupled channel resistances of two stages, i.e., a MOS transistor of column select gate CSG and a MOS transistor of charge confinement gate, the voltage drop due to such channel resistance can be prevented, so that the decrease of voltage difference transmitted to sense internal nodes SAN an d/SAN can be suppressed. Accordingly, a sufficiently large sense margin (read margin) is ensured. This is because decrease of the voltage level of the sense internal node can be made larger with a MOS transistor of one stage, since the sense internal node precharged to an H level is discharged through the bit line.

Further, as the channel resistance through which the bit line voltage is transmitted is only of a MOS transistor of one stage, voltage difference ΔV of bit lines BL and /BL is rapidly transmitted to sense internal nodes SAN and /SAN. Accordingly, a large read margin is ensured when the sense amplifier is to be activated at the same timing as the conventional case.

Figure 11:
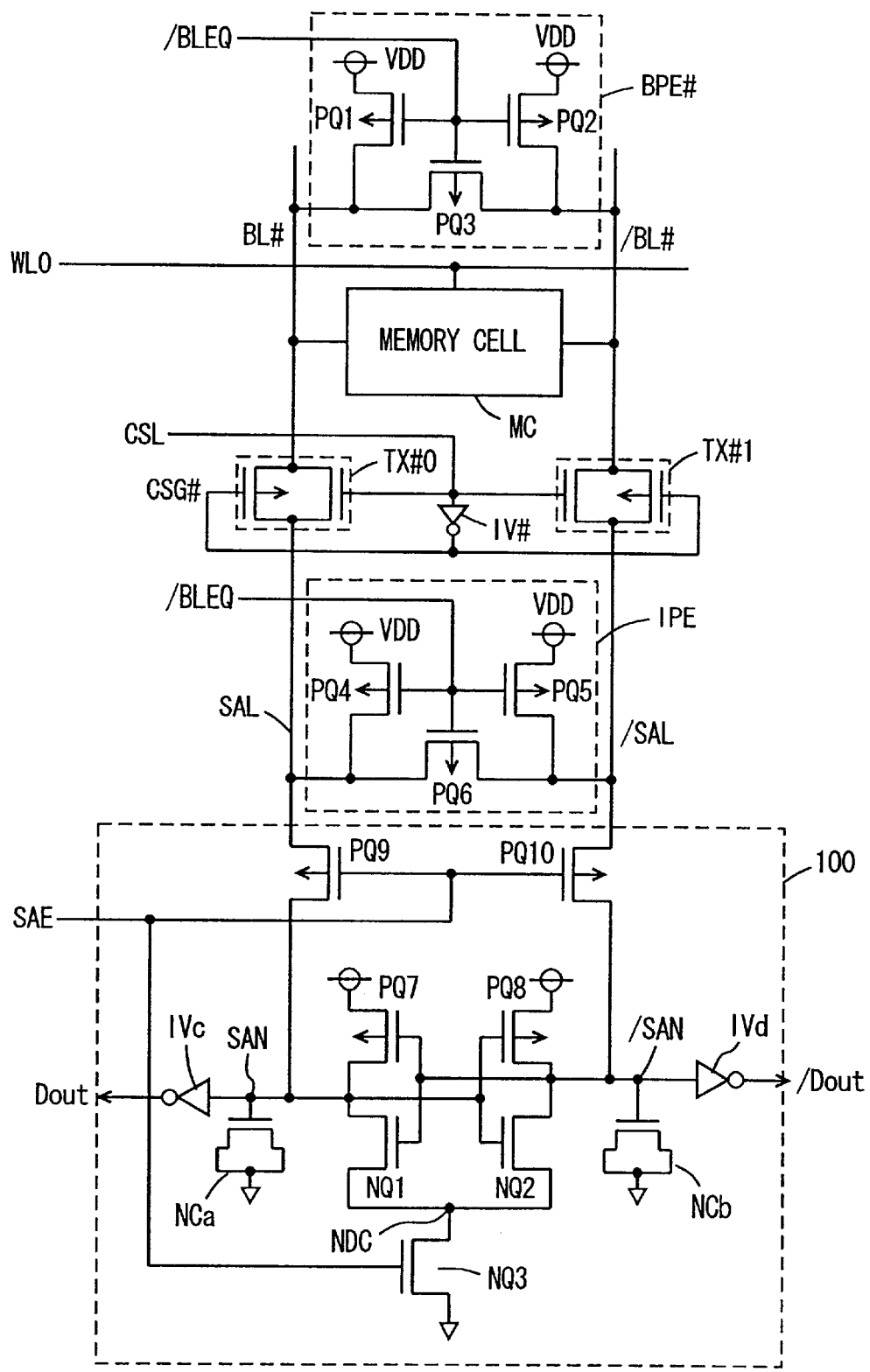
FIG. 11 shows a specific configuration of the sense amplifier shown in FIG. 10.
Figure 12:
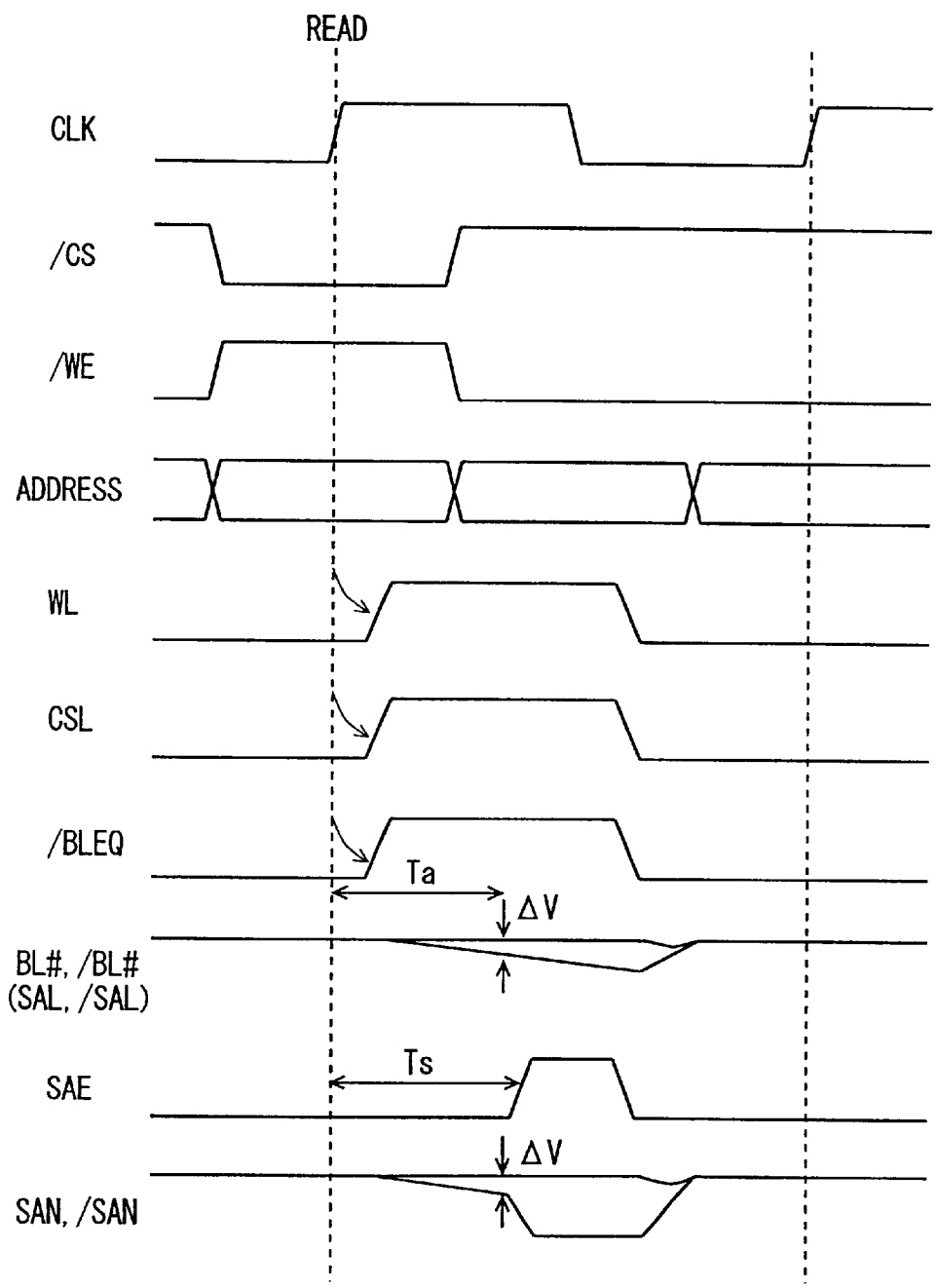
FIG. 12 shows signal waveforms representing an operation of the configuration shown in FIG. 11.

Still further, sense internal nodes SAN and /SAN are coupled to internal read data line pair RLP that is not coupled to the write driver. In the conventional configuration as shown in FIG. 11, the write driver is connected to internal nodes SAL and /SAL, and charge confining MOS transistors PQ9 and PQ10 are made conductive at the time of data writing. Therefore, when internal node SAL is driven to a ground voltage level of an L level, for example, pulling-up P channel MOS transistor PQ8 in sense amplifier 100 turns ON, and a column current flows from sense amplifier 100 to a selected bit line during a transition period in which the bit line voltage changes. In data writing, the P channel MOS transistor connected to this bit line of the L level is rendered conductive during the transition period until the voltage of the bit line is driven to the power supply voltage VDD level. Thus, a current is also supplied to the associated bit line of the L level, consuming an excessive current.

In the configuration shown in FIG. 2, however, read column select gate RG# is non-conductive in data writing, so that sense amplifier 1 is isolated from selected bit lines BL and /BL. Accordingly, the current flow from sense amplifier 1 to the bit lines at the time of data writing as in the conventional case can be prevented, and thus, current consumption is reduced.

Figure 4:
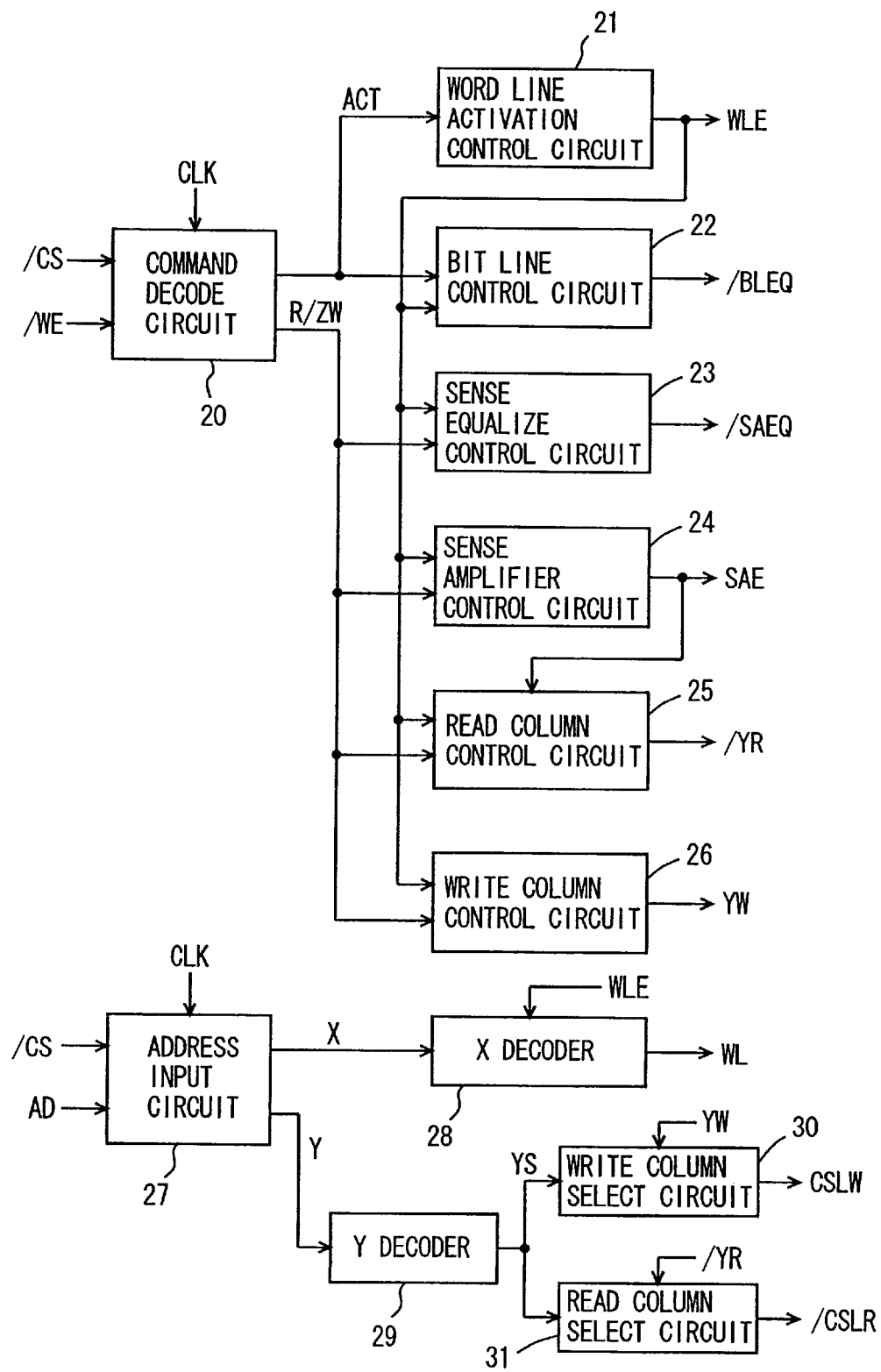
FIG. 4 schematically shows a configuration of a peripheral circuit of the SRAM according to the first embodiment.

FIG. 4 schematically shows a configuration of a peripheral circuit of the SRAM according to the first embodiment. Referring to FIG. 4, a peripheral control circuitry for generating control signals includes: a command decode circuit 20 that determines logic states of externally supplied chip select signal /CS and write enable signal /WE at a rising edge of reference clock signal CLK, and activates an access instructing signal ACT and a read/write instructing signal R/ZW according to the determined result; a word line activation control circuit 21 that generates a word line activating signal WLE according to access instructing signal ACT from command decode circuit 20; a bit line control circuit 22 that is responsive to access instructing signal ACT and word line activating signal WLE for activating/ inactivating bit line precharge/equalize instructing signal /BLEQ; a sense equalize control circuit 23 that is responsive to word line activating signal WLE and read/write instructing signal R/ZW for activating/inactivating sense internal node precharge/equalize instructing signal /SAEQ; a sense amplifier control circuit 24 that is responsive to word line activating signal WLE and read/write instructing signal R/ZW for activating/inactivating sense amplifier activating signal SAE; a read column control circuit 25 that is responsive to word line activating signal WLE, read/write instructing signal R/ZW and sense amplifier activating signal SAE for activating a read column select operation activating signal /YR for a prescribed period of time; and a write column control circuit 26 that is responsive to word line activating signal WLE and read/write instructing signal R/ZW for activating a write column select operation activating signal YW.

Command decode circuit 20 activates access instructing signal ACT in a one-shot pulse form when chip select signal ICS is in an active state of an L level at a rising edge of clock signal CLK. At this time when chip select signal /CS is at the L level at a rising edge of reference clock signal CLK, if write enable signal /WE is at an L level, command decode circuit 20 determines that a write command is supplied, to set read/write instructing signal R/ZW to an L level to instruct data writing. At this time, if write enable signal /WE is at an H level, command decode circuit 20 sets read/write instructing signal R/ZW to an H level to instruct data reading. Access instructing signal ACT and read/write instructing signal R/ZW are each generated in a one-shot pulse form.

When access instructing signal ACT is activated, word line activation control circuit 21 activates word line activating signal WLE for a prescribed period of time. Word line activation control circuit 21 is formed, e.g., of a one shot pulse generating circuit. Word line activating signal WLE determines a memory cell select cycle.

Bit line control circuit 22 is formed, e.g., of a flip-flop, and drives bit line precharge/equalize instructing signal /BLEQ to an inactive state of an H level when access instructing signal ACT is activated, and drives bit line precharge/ equalize instructing signal /BLEQ to an active state of an L level when word line activating signal WLE goes from an H level to an L level of an inactive state.

Sense equalize control circuit 23 is formed, e.g., of a flip-flop. In the case where read/write instructing signal R/ZW is at an H level instructing a reading operation, when word line activating signal WLE attains an active state of an H level, sense equalize control circuit 23 holds sense internal node precharge/equalize instructing signal /SAEQ at an H level while word line activating signal WLE is at an active state. In the case where read/write instructing signal R/ZW is at an L level instructing a data writing operation, sense equalize control circuit 23 maintains sense internal node precharge/equalize instructing signal /SAEQ at an active state of an L level.

Sense amplifier control circuit 24 is formed, e.g., of a rise delaying circuit. In the state where read/write instructing signal R/ZW is at an H level instructing data reading, when word line activating signal WLE is activated, sense amplifier control circuit 24 activates sense amplifier activating signal SAE after a lapse of a prescribed period of time. When word line activating signal WLE transits into an inactive state, sense amplifier control circuit 24 inactivates sense amplifier activating signal SAE.

When read/write instructing signal R/ZW instructs data reading, read column control circuit 25 drives read column select operation activating signal /YR to an L level in response to activation of word line activating signal WLE. Read column control circuit 25 drives this read column activating signal /YR to an inactive state of an H level when sense amplifier activating signal SAE is activated. Accordingly, the read column select operation is completed after the start of the sense operation of the sense amplifier. The sense amplifier and the bit line are thus isolated from each other, and the sense amplifier performs the charge confinement sense operation. Read column control circuit 25 is formed, e.g., of a flip-flop that is set in response to activation of word line activating signal WLE and reset in response to activation of sense amplifier activating signal SAE in data reading.

When read/write instructing signal R/ZW is at an L level instructing data writing, write column control circuit 26 drives write column activating signal YW to an active state of an H level in response to activation of word line activating signal WLE. Write column control circuit 26 also generates a write driver enable signal WDE, which in turn is applied to write driver 2 shown in FIG. 1.

The peripheral circuit further includes: an address input circuit 27 that takes in an externally supplied address signal AD at the time when chip select signal /CS is in an active state of an L level at a rising edge of reference clock signal CLK, and generates internal X address signal X and Y address signal Y; an X decoder 28 that decodes internal X address signal X and drives an addressed word line to a selected state in response to activation of word line activating signal WLE; a Y decoder 29 that decodes internal Y address signal Y from address input circuit 27 to generate a column select signal YS; a write column select circuit 30 that drives a write column select line CSLW to a selected state according to column select signal YS in activation of write column select operation activating signal YW; and a read column select circuit 31 that drives a read column select line /CSLR to a selected state according to column select signal YS in activation of read column select operation activating signal /YR.

When chip select signal /CS is at an H level at a rising edge of reference clock signal CLK, address input circuit 27 does not perform the address take-in operation, and maintains the reset state. X decoder 28 includes a decode circuit that operates statically, and decodes the internal X address signal, and drives, according to the decoded result, a word line WL corresponding to the addressed row to a selected state while word line activating signal WLE is in an active state.

Y decoder 29 performs the decoding operation statically, and generates column select signal YS according to internal Y address signal Y. Write column select circuit 30 includes a select circuit provided corresponding to each column select signal YS output from Y decoder 29 (each column of memory array), and drives write column select line CSLW corresponding to the associated column select signal YS to an active state when write column select operation activating signal YW is in an active state.

Read column select circuit 31 includes a select circuit corresponding to each column select signal YS output from Y decoder 29, which drives the corresponding read column select line CSLR to an active state according to column select signal YS from Y decoder 29 while read column select operation activating signal /YR is in an active state.

Read column select operation activating signal /YR is inactivated after sense amplifier activating signal SAE is activated. More specifically, read column select circuit 31 sets the read column select gate of a selected column to a conductive state in accordance with column select signal YS from Y decoder 29. This read column select circuit 31 is then inactivated after the activation of sense amplifier activating signal SAE, and read column select gate RG in the selected state is rendered non-conductive. Thus, by controlling the read column select operation according to sense amplifier activating signal SAE, it becomes possible to ensure that the read column select gate is rendered non-conductive after the start of the sense operation, so that the sense amplifier can perform the charge confinement sense operation.

In the configuration shown in FIG. 4, Y decoder 29 performs the decoding operation statically. However, word line activating signal WLE may also be supplied to Y decoder 29 to decide the operating time of Y decoder 29. Further, address input circuit 27 may be so configured as to reset internal X address signal X and internal Y address signal Y both to an initial state when word line activating signal WLE is inactivated.

In addition, command decode circuit 20 may generate, instead of read/write instructing signal R/ZW, a read instructing signal in accordance with a read command and a write instructing signal in accordance with a write command.

Still further, sense internal node precharge/equalize circuit 1a may be provided outside the sense amplifier 1.

As explained above, according to the first embodiment of the present invention, the read column select gate used in column selection in data reading is also utilized as a charge confinement gate of the sense amplifier. This common use decreases the number of stages of gates in the charge transfer path from a bit line to the sense amplifier internal node, and thus allows fast transfer of charges, and also decreases the voltage drop at the sense internal node to ensure a large read margin.

Further, by utilizing this read column select gate, the timing for activating the sense amplifier and the timing for confining the charges can be differentiated from each other. Accordingly, the sense operation can be performed under the state where the sense amplifier internal node is being connected to the bit line of a selected column. Thus, the capacitance of the sense internal node can be increased to enable an accurate sense operation while suppressing any effect of coupling noise or others at the start of the sense operation.

Second Embodiment

Figure 5:
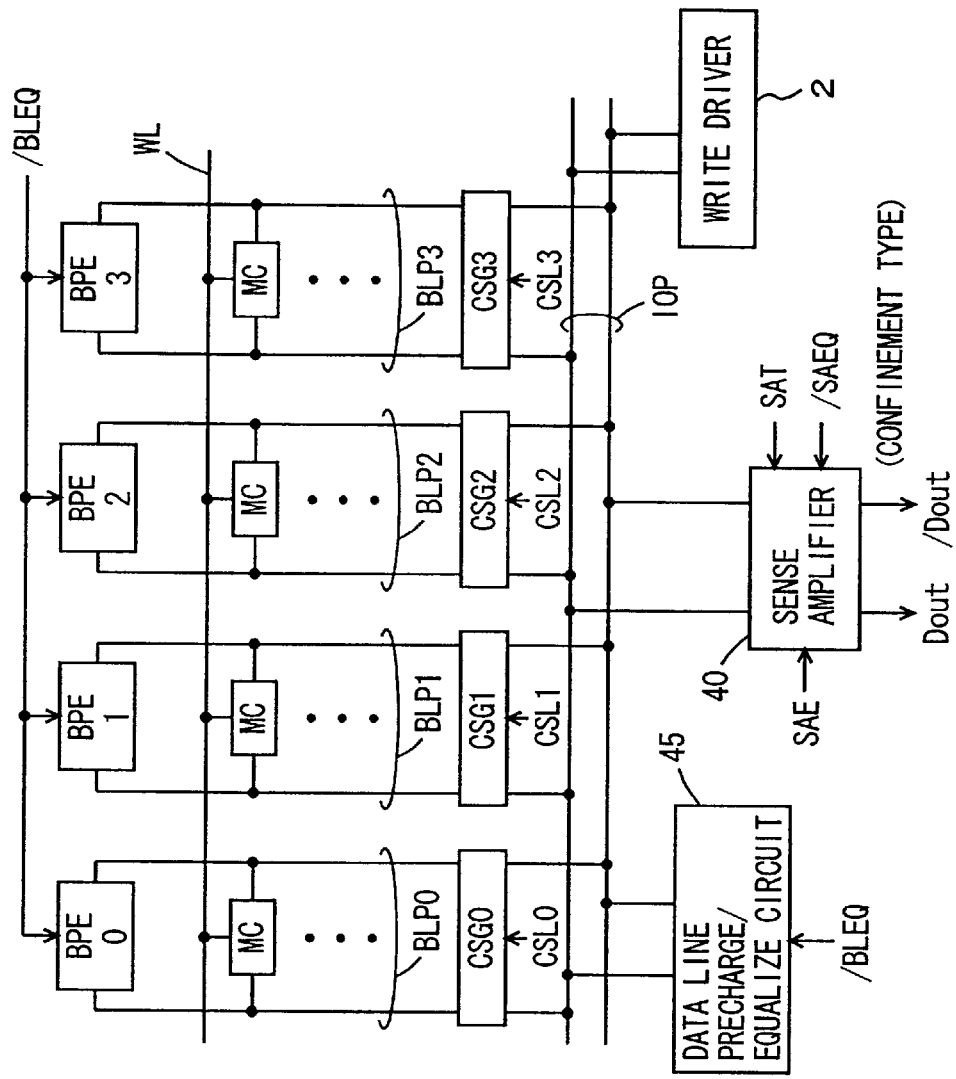
FIG. 5 schematically shows a configuration of a portion related to data writing/reading of an SRAM, according to a second embodiment of the present invention.

FIG. 5 schematically shows a configuration of a portion related to data reading/writing of the SRAM according to the second embodiment of the present invention. In FIG. 5, memory cells MC arranged in one row and four columns are shown representatively, which are connected to a word line WL. Bit line pairs BLP0–BLP3, placed for respective columns of the memory cells, are provided with. bit line precharge/equalize circuits BPE0–BPE3 and column select gates CSG0–CSG3, respectively.

Bit line precharge/equalize circuits BPE0–BPE3 are activated in response to activation of bit line precharge/equalize instructing signal /BLEQ, to precharge and equalize the corresponding bit line pairs BLP0–BLP3 to a power supply voltage level, as in the conventional case.

Column select gates CSG0–CSG3 are rendered conductive selectively according to the column select signals on column select lines CSL0–CSL3. These column select gates CSG0–CSG3 are commonly coupled to internal data line pair IOP.

Internal data line pair IOP is provided with a write driver 2 for performing data writing, a sense amplifier 40 for performing data reading, and a data line precharge/equalize circuit 45.

Data line precharge/equalize circuit 45 responds to activation of bit line precharge/equalize instructing signal /BLEQ to precharge and equalize each data line of the internal data line pair to a power supply voltage level.

Sense amplifier 40 is a charge confinement type sense amplifier. In sense amplifier 40, the sense internal node is precharged to a prescribed voltage level in response to activation of sense internal node precharge/equalize instructing signal /SAEQ. When a charge confinement instructing signal (isolation control signal) SAT is activated, the sense internal node is separated from internal data line pair IOP. Sense amplifier 40 also receives sense amplifier activating signal SAE.

In the configuration shown in FIG. 5, the timing for confining charges in sense amplifier 40 is made different from the timing for activating the sense amplifier. Thus, the capacitance of the sense internal node at the start of the sense operation is made large, so that the influence of noise due to coupling or the like is reduced. Accordingly, the sense operation can be performed stably and accurately.

Figure 6:
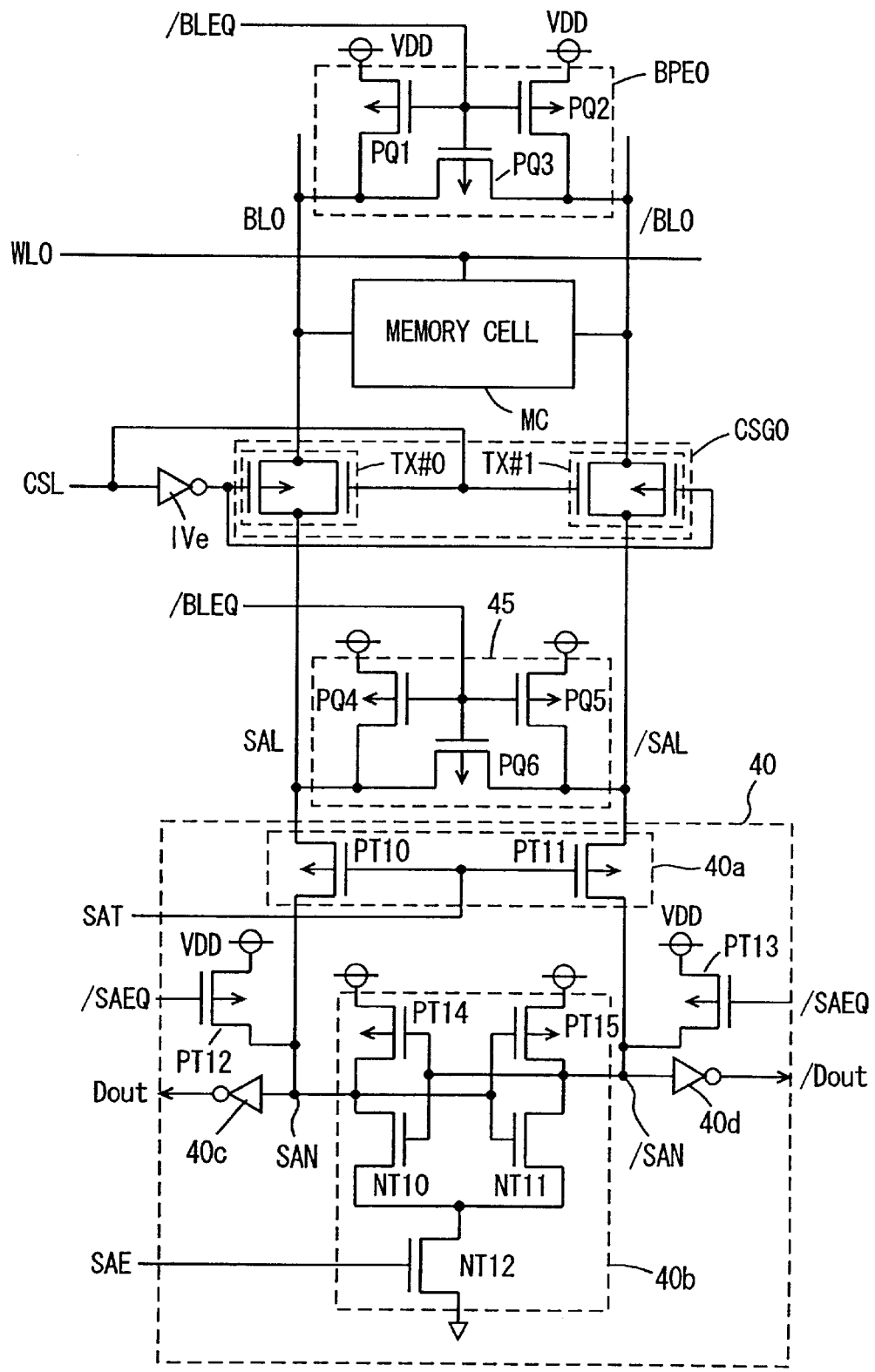
FIG. 6 shows a specific configuration of a main portion of the SRAM according to the second embodiment.

FIG. 6 shows a detailed configuration of a portion related to the data reading in the circuit of FIG. 5. In FIG. 6, one bit line pair BL0 and /BL0 is shown. The bit line precharge/ equalize circuit BPE0 provided for this bit line pair BL0 and /BL0 includes, as in the conventional case, P channel MOS transistors PQ1–PQ3 that are rendered conductive in response to activation of bit line precharge/equalize instructing signal /BLEQ. MOS transistors PQ1 and PQ2 are precharging transistors, and transmit power supply voltage VDD to respective bit lines BL0 and /BL0 when made conductive. MOS transistor PQ3 is an equalizing transistor, and electrically short-circuits bit lines BL0 and /BL0 when made conductive.

Column select gate CSG0 includes CMOS transmission gates TX#0 and TX#1 provided for bit lines BL0 and /BL0, respectively. CMOS transmission gates TX#0 and TX#1 are rendered conductive according to a column select signal on column select line CSL and a complementary column select signal from inverter IVe, and couple bit lines BL0 and /BL0 to nodes SAL and /SAL (internal data line pair) when made conductive.

Data line precharge/equalize circuit 45 includes P channel MOS transistors PQ4–PQ6 that are rendered conductive when bit line precharge/equalize instructing signal /BLEQ is activated, as in the conventional case. MOS transistors PQ4 and PQ5 transmit power supply voltage VDD to nodes SAL and /SAL when conductive. MOS transistor PQ6 electrically short-circuits nodes SAL and /SAL when conductive.

The configurations of these bit line peripheral circuits are identical to those of the conventional SRAM shown in FIG. 11.

Sense amplifier 40 includes: a charge confinement gate 40a that is rendered non-conductive, when charge confinement instructing signal (isolation control signal) SAT is activated, to isolate nodes SAL and /SAL from sense internal nodes SAN and /SAN; a sense amplifier circuit 40b that is activated, in response to activation of sense amplifier activating signal SAE, to differentially amplify the voltages on sense internal nodes SAN and /SAN; an inverter 40c that inverts the signal of sense internal node SAN to generate internal read data Dout; an inverter 40d that inverts the signal of sense internal node /SAN to generate internal read data /Dout; and P channel MOS transistors PT12 and PT13 that are rendered conductive, in response to activation (to an L level) of sense internal node precharge/equalize instructing signal /SAEQ, to precharge respective sense internal nodes SAN and /SAN to power supply voltage VDD level.

Charge confinement gate 40a includes P channel MOS transistors PT10 and PT11 that are rendered non-conductive, in response to activation of charge confinement instructing signal SAT, to isolate nodes SAL and /SAL from sense internal nodes SAN and /SAN.

Sense amplifier circuit 40b includes, as in the conventional case, P channel MOS transistors PT14 and PT15 and N channel MOS transistors NT10–NT12. When the sense amplifier is activated, MOS transistors PT14 and NT12 constitute a CMOS inverter circuit, and MOS transistors PT15 and NT11 constitute another CMOS inverter circuit. MOS transistor NT12 activates sense amplifier circuit 40b in response to sense amplifier activating signal SAE.

As shown in FIG. 6, in sense amplifier 40, activation/ inactivation of charge confinement gate 40a is controlled by charge confinement instructing signal SAT, and activation/ inactivation of sense amplifier circuit 40b is controlled by sense amplifier activating signal SAE. Thus, as in the first embodiment, the activating timing of sense amplifier circuit 40b and a period during which charge confinement gate 40a is kept non-conductive can both be optimized. Accordingly, the confinement sense operation is performed efficiently, while suppressing the influences of coupling noise and the like, so that a fast sense operation is achieved. Now, the operation of the configuration shown in FIG. 6 will be described with reference to signal waveforms in FIG. 7.

Read command READ for instructing data reading and an address signal are supplied in synchronization with a rising edge of reference clock signal CLK. According to the read command READ, bit line precharge/equalize instructing signal /BLEQ is driven from an L level of an active state to an H level of an inactive state to release the internal equalized state. In response, precharge/equalize circuits BPE and 45 enter an inactive state, and the precharging/ equalizing operation of bit lines BL, /BL and internal data line pair IOP is completed. Similarly, sense internal node precharge/equalize instructing signal /SAEQ attains an inactive state, and MOS transistors PT12 and PT13 in sense amplifier 40 are rendered non-conductive. Thus, the precharging operation of sense internal nodes SAN and /SAN is completed.

In parallel with the completion of the precharging operation, the address signal is decoded. According to the decoded result, word line WL corresponding to an addressed row is driven to a selected state, and column select line CSL corresponding to an addressed column is driven to a selected state. A voltage difference according to the data of the memory cells connected to the selected word line WL appears on the corresponding bit lines BL and /BL. Column select gate CSG provided for the selected column is rendered conductive, and bit lines BL and /BL are coupled to internal data line pair IOP. At this time, when the column is being selected, charge confinement instructing signal SAT is driven to an L level according to read command READ, and charge confinement gate 40a in sense amplifier 40 is rendered conductive.

Through the series of operations above, after an elapse of a time ts since the application of read command READ, voltage difference ΔV occurred between bit lines BL and /BL is transmitted via charge confinement gate 40e to sense internal nodes SAN and /SAN. When this voltage difference ΔV is transmitted to sense internal nodes SAN and /SAN, sense amplifier activating signal SAE is activated, and sense amplifier circuit 40b is activated, so that the voltages of sense internal nodes SAN and /SAN are differentially amplified.

Upon activation of sense amplifier activating signal SAE, charge confinement instructing signal SAT is in an inactive state of an L level, and charge confinement gate 40e is kept conductive. Thus, as in the first embodiment, bit lines BL and /BL are coupled to sense internal nodes SAN and /SAN via the internal data line pair, and sense internal nodes SAN and /SAN have large capacitances. Even if coupling noise or the like arises at the start of sense operation, such a large capacitance serves to suppress the influence of the noise. Accordingly, the sense operation can be performed while stably maintaining the voltages of sense internal nodes SAN and /SAN.

A time Δtk after the start of the sense operation, charge confinement instructing signal SAT is driven to an active state of an H level, and charge confinement gate 40a is rendered non-conductive. Sense internal nodes SAN and /SAN are disconnected from nodes SAL and /SAL (internal data line pair IOP), so that the charge confinement sense operation is performed by sense amplifier 40, enabling a fast sense operation.

When one data reading cycle is completed, the selected word line WL and the selected column select line CSL are driven to a non-selected state, bit lines BL and /BL return to an original, precharged state, and internal data line pair IOP also returns to an original, precharged state. Sense amplifier activating signal SAE attains an inactive state, and sense amplifier circuit 40 becomes inactive. Sense internal node precharge/equalize instructing signal /SAEQ attains an active state, and sense internal nodes SAN and /SAN return to a precharged state.

Figure 7:
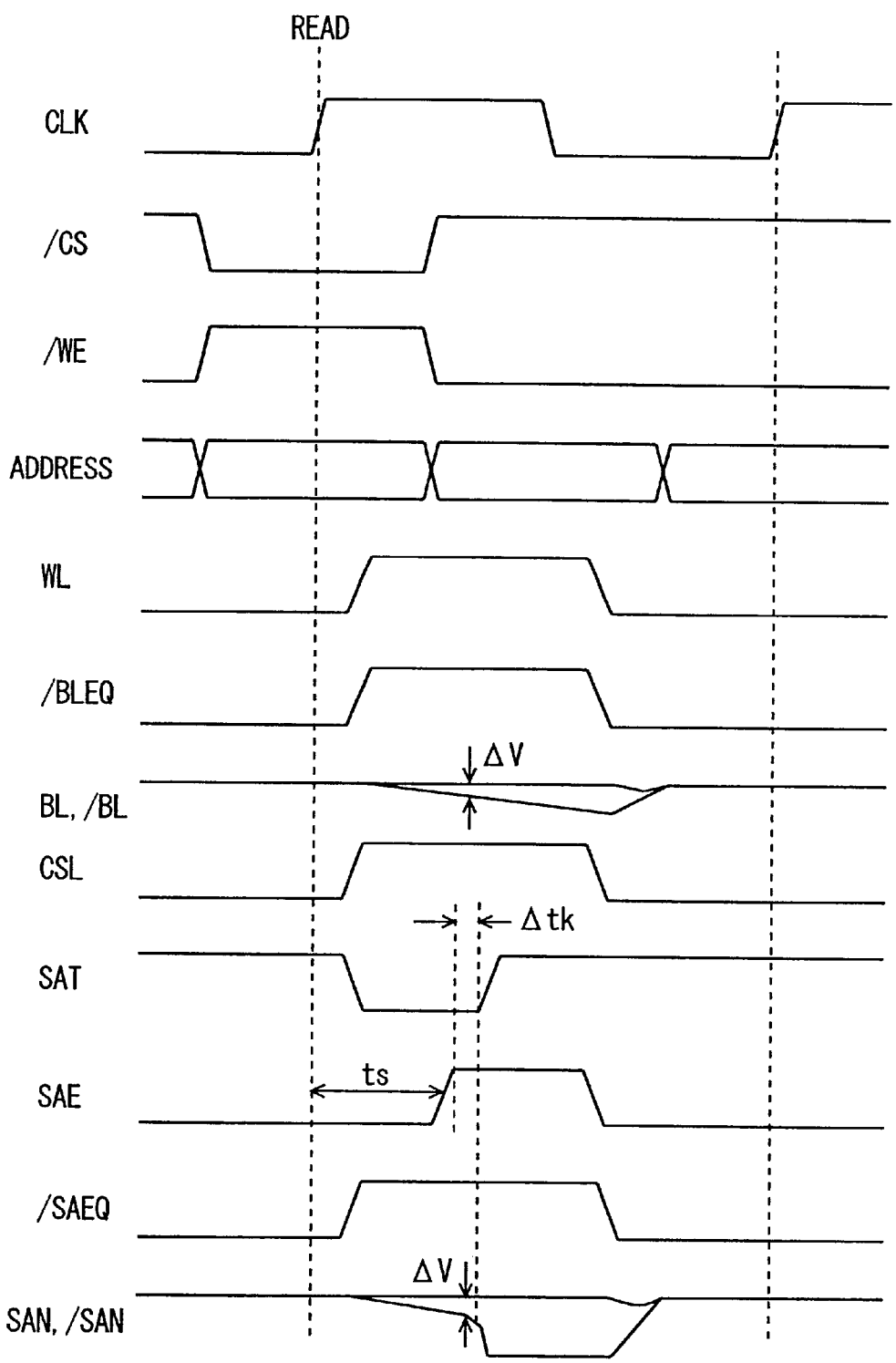
FIG. 7 shows signal waveforms representing an operation of the configuration shown in FIG. 6.

In the configuration shown in FIG. 6, sense amplifier 40 may be provided with an equalizing P channel MOS transistor that electrically short-circuits sense internal nodes SAN and /SAN in response to sense internal node precharge/ equalize instructing signal /SAEQ. FIG. 7 shows signal waveforms in the case where such an equalizing transistor is provided for sense internal nodes SAN and /SAN.

As shown in FIG. 6, sense amplifier 40 contains the charge confinement gate, and activation/inactivation of sense amplifier circuit 40b and of charge confinement gate 40a are controlled by separate control signals from each other. Thus, it becomes possible to increase the capacitance of the sense internal nodes at the start of the sense operation, and to perform the charge confinement sense operation after the voltages of the sense internal nodes have become large enough to prevent the influence of noise. Accordingly, the sense operation can be performed fast with high accuracy. Since it is unnecessary to place gate capacitor for stabilizing the voltages of the sense internal nodes within the sense amplifier, the layout area of sense amplifier 40 can also be reduced.

In the configuration shown in FIG. 6, charge confinement gate 40a is provided in sense amplifier 40. This charge confinement gate 40a is made conductive only for a prescribed period of time in data reading, and otherwise kept non-conductive. Thus, the sense amplifier circuit is isolated from the internal data line pair in data writing. Therefore, even if complementary data are transmitted from the write driver to the internal data line pair, such complementary internal write data. will not affect sense amplifier 40. The current flow from the sense amplifier side to the internal data line receiving the write data of an L level as caused in the conventional case can be prevented. Accordingly, the current consumption can be decreased.

Figure 8:
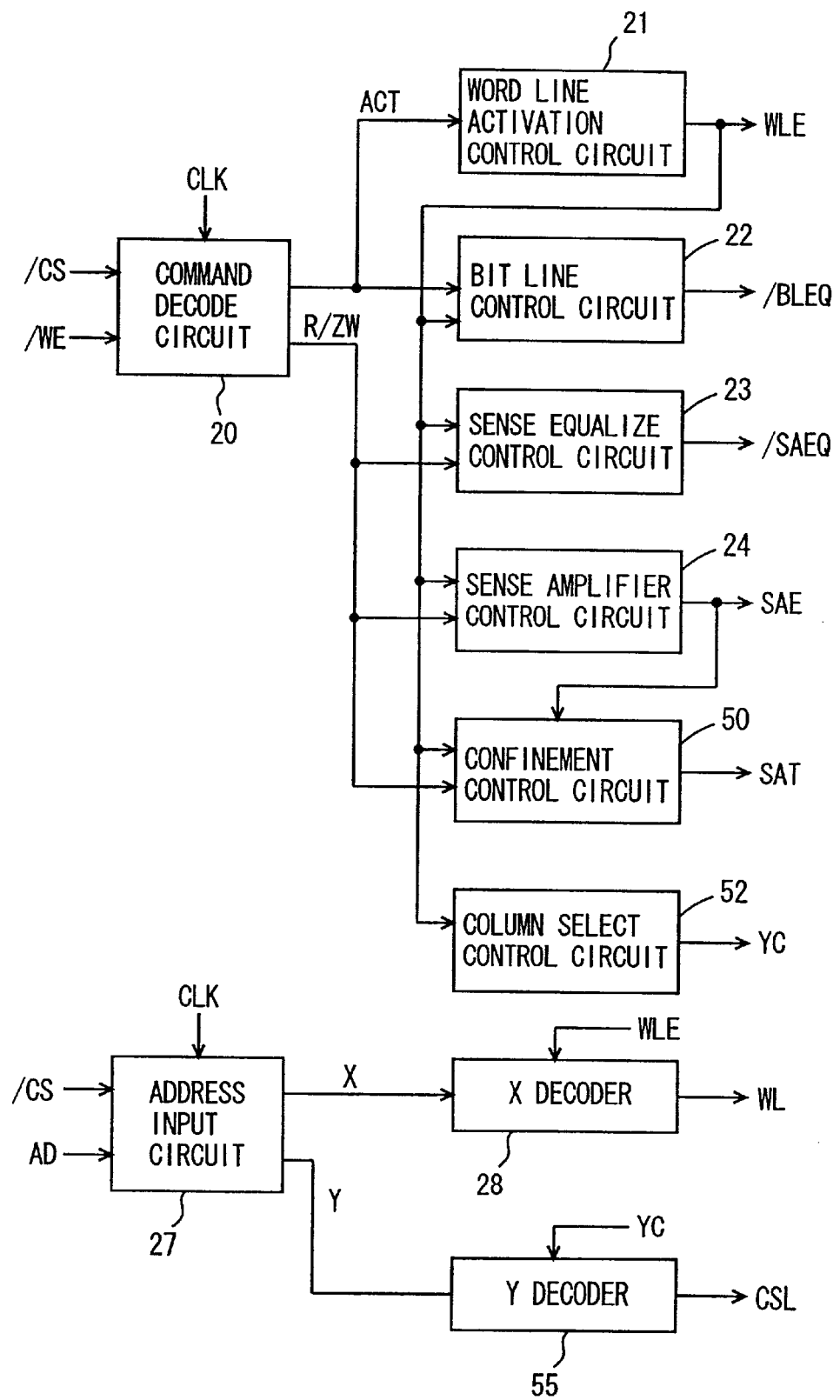
FIG. 8 schematically shows a configuration of a peripheral circuit of the SRAM according to the second embodiment.
Figure 9:
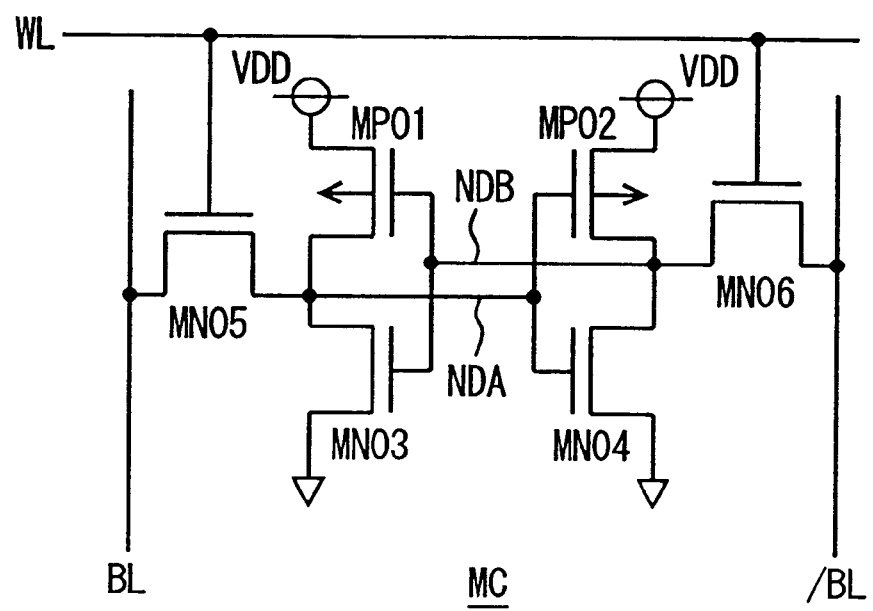
FIG. 9 shows an exemplary configuration of a conventional SRAM cell.
Figure 10:
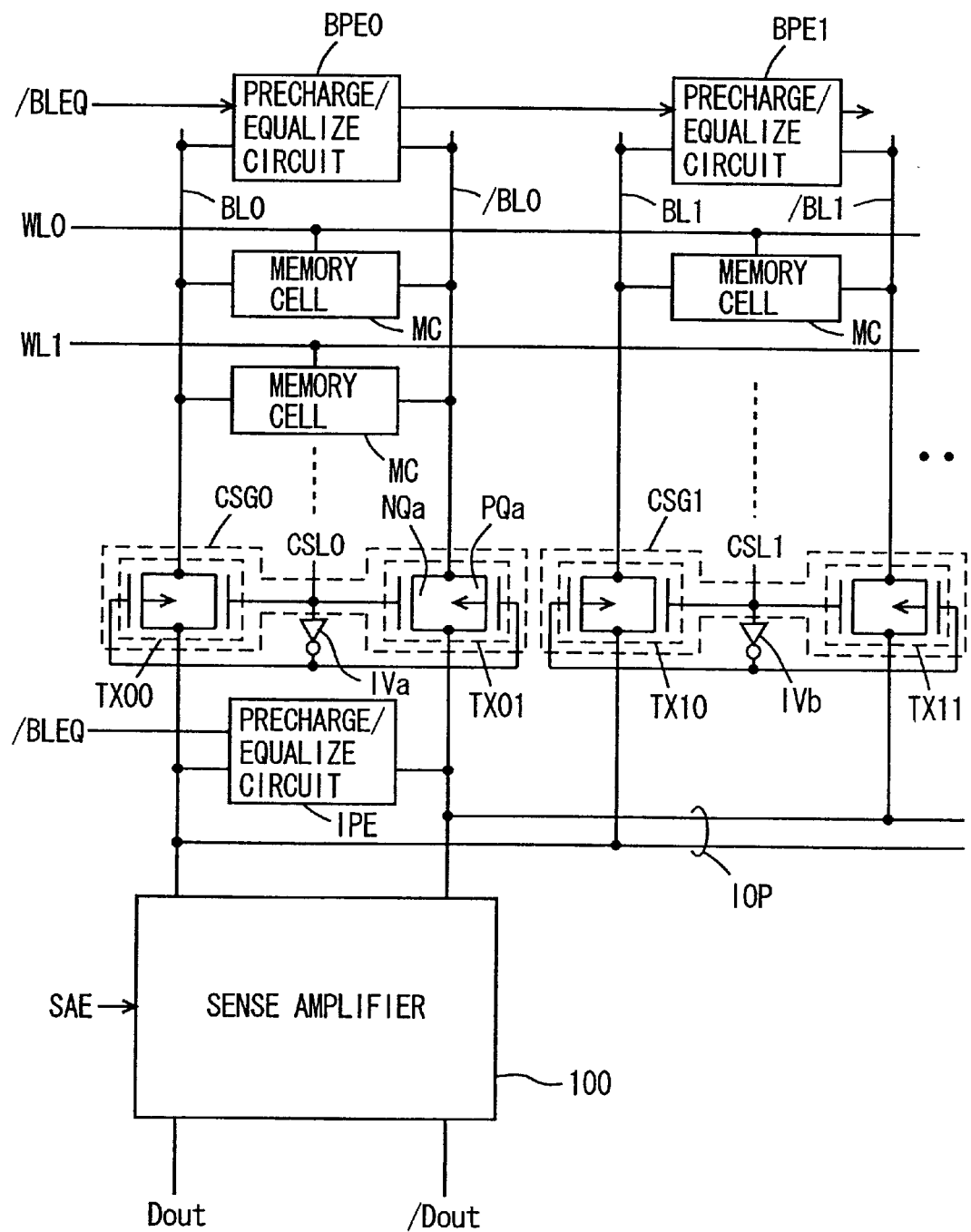
FIG. 10 schematically shows a configuration of a portion related to data reading of a conventional SRAM.

FIG. 8 schematically shows a configuration of the peripheral circuit of the SRAM according to the second embodiment. Referring to FIG. 8, the peripheral control circuit of the present embodiment differs from that shown in FIG. 4 in the configurations of the confinement control circuit 50 for generating charge confinement instructing signal SAT and the column select control circuit 52 for generating a column select operation activating signal YC. For other portion, the configuration of the peripheral control circuit of the present embodiment is identical to that shown in FIG. 4, and therefore, the same or corresponding portions are denoted by the same reference numerals, and detailed description thereof is not repeated.

Confinement control circuit 50 receives read/write instructing signal R/ZW output from command decode circuit 20 and word line activating signal WLE, and drives charge confinement instructing signal SAT to an inactive state of an L level when word line activating signal WLE attains an active state in data reading and to an active state of an H level when sense amplifier activating signal SAE output from sense amplifier control circuit 24 is activated.

Column select control circuit 52 generates column select operation activating signal YC in response to word line activating signal WLE. Instead of this word line activating signal WLE, access instructing signal ACT may be supplied to column select control circuit 52.

The configuration related to generation of the internal addresses of the present embodiment differs from the configuration in FIG. 4 in the portion for driving the column select line CSL. The column select signal on column select line CSL is generated from Y decoder 55 that decodes internal Y address signal Y from address input circuit 27 in accordance with column select operation activating signal YC supplied from column select control circuit 52. In the second embodiment, the write column select gate and the read column select gate are commonly provided, and column select gate CSG is driven in data reading and in data writing. The period for driving column select line CSL is determined by the column select operation activating signal YC supplied to Y decoder 55.

Word line WL is driven by X decoder 28 that decodes internal X address signal X received from address input circuit 27 in response to activation of word line activating signal WLE, as in the configuration shown in FIG. 4.

As explained above, according to the second embodiment, the confinement gate circuit is provided between the sense amplifier circuit and the internal data line pair, and conduction/non-conduction of the confinement gate is controlled by the isolation control signal that is different from the sense amplifier activating signal. Thus, the sense operation and the charge confinement operation can be each performed at an optimum timing. Further, the charge confinement gate is made conductive only for a prescribed period of time in data reading, and therefore, the sense internal nodes and the internal data line pair can be isolated from each other in data writing. Accordingly, the sense amplifier circuit is prevented from adversely influencing the internal write data, and the current consumption can also be decreased.

Further, as in the first embodiment, the charge confinement gate is held in the conductive state at the start of the sense operation. Thus, the load capacitance of the sense internal nodes can be made large, so that a stable sense operation is ensured, with the influences of coupling noise and others suppressed.

Other Applications

In the description above, the sense amplifier for reading internal data in the SRAM has been explained. However, the charge confinement type sense amplifier can be employed in the data reading portion of a read only memory (ROM) or the like.

Further, the sense amplifier of the present invention may be utilized as a preamplifier in a DRAM to amplify data of a selected memory cell transmitted onto the internal data line pair for transmission to an output buffer. In this case, the preamplifier is formed using a charge confinement type amplifying circuit, and the charge confinement gate and the amplifying circuit are controlled by separate control signals. Thus, in this charge confinement type preamplifier, it becomes possible to perform the charge confinement amplifying operation with the internal data line pair utilized as capacitance component at the start of preamplifying operation. Accordingly, a small-amplitude signal of the internal data line pair can be amplified rapidly for transmission to a circuit at a subsequent stage.

In addition, the clock synchronous SRAM operating in synchronization with the clock signal has been described above. However, an SRAM whose internal operating timing is determined according to an address transition detecting signal, for example, can be employed in the present invention.

In general, the sense amplifier of the present invention can be employed as an amplifying circuit in a configuration where a small amplitude signal is amplified for transmission to a circuit at a subsequent stage.

As explained above, according to the present invention, a signal for controlling a charge confinement gate of a sense amplifier and a signal for activating the sense amplifier are provided separately. Thus, the sense operation and the charge confinement operation can be each performed at an optimum timing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   an internal signal line for transmitting data of a selected memory cell;
   a sense amplifier activated, when a sense amplifier activating signal is activated, for amplifying a voltage of a sense internal node; and
   a charge confinement gate responsive to activation of an isolation control signal different from said sense amplifier activating signal, for isolating said internal signal line from said sense internal node, said isolation control signal being activated after transference of said data of the selected memory cell to said sense internal node while the selected memory cell is in a selected state.

2. The semiconductor memory device according to claim 1, further comprising a plurality of memory cells including the selected memory cell arranged in a plurality of columns; wherein
   said internal signal line is placed for each respective column, and has the memory cells in a corresponding column connected thereto; and
   said charge confinement gate includes a column select circuit for selecting the internal signal line placed corresponding to an addressed column of said plurality of columns in response to said isolation control signal to connect the selected internal signal line to said sense internal node.

3. The semiconductor memory device according to claim 1, further comprising a plurality of memory cells including the selected memory cell arranged in a plurality of columns, and a column select circuit placed for each column for connecting a corresponding column to said internal signal line in response to a column select signal, wherein
   said internal signal line is commonly provided for said plurality of columns, and
   said charge confinement gate isolates said internal signal line from said sense internal node in response to said isolation control signal activated after activation of said column select signal in data reading, said isolation control signal being activated after being held in an inactive state for a prescribed period of time in response to a read command instructing said data reading.

4. The semiconductor memory device according to claim 1, wherein said sense amplifier activating signal is activated when said isolation control signal is in an inactive state and said charge confinement gate is in a conductive state, and said isolation control signal is activated after activation of said sense amplifier activating signal to render said charge confinement gate non-conductive.

5. A semiconductor memory device, comprising:
   a plurality of memory cells arranged in rows and columns;
   a sense amplifier commonly provided for said plurality of memory cells, for amplifying data of a selected memory cell of said plurality of memory cells when activated;
   sense control circuitry responsive to a reading operation instructing signal, for generating a sense amplifier activating signal to activate said sense amplifier;
   a confinement gate circuit provided for each column, for coupling a corresponding column to an internal node of said sense amplifier when conductive; and
   confinement control circuitry responsive to said reading operation instructing signal and a column address signal, for setting the confinement gate circuit corresponding to an addressed column to a conductive state for a prescribed period of time, said sense amplifier activating signal being activated before said confinement gate circuit enters a non-conductive state.

6. The semiconductor memory device according to claim 5, wherein a period in which said sense amplifier is active and a period in which said confinement gate is conductive have a period overlapping with each other.

7. A semiconductor memory device, comprising:

a plurality of memory cells arranged in rows and columns;

a sense amplifier commonly provided for said plurality of memory cells, for amplifying data in a selected memory cell of said plurality of memory cells when activated;

sense control circuitry responsive to a reading operation instructing signal, for generating a sense amplifier activating signal to activate said sense amplifier;

a column select gate responsive to a column select signal, for coupling an addressed column to an internal signal line;

a confinement gate circuit for coupling said internal signal line to an internal node of said sense amplifier when conductive; and confinement control circuitry responsive to said reading operation instructing signal, for generating a control signal, different from said sense amplifier activating signal, for setting said confinement gate circuit corresponding to an addressed column to a conductive state for a prescribed period of time, said sense amplifier activation signal being activated before said confinement gate circuit enters a non-conductive state.

8. The semiconductor memory device according to claim 7, wherein a period in which said sense amplifier is active and a period in which said confinement gate is conductive have a period overlapping with each other.

* * * * *